(12) United States Patent
Shannon

(10) Patent No.: US 12,240,102 B2
(45) Date of Patent: *Mar. 4, 2025

(54) SYSTEMS, DEVICES, AND METHODS FOR ROBOTIC END EFFECTORS

(71) Applicant: Sanctuary Cognitive Systems Corporation, Vancouver (CA)

(72) Inventor: Connor Richard Shannon, Vancouver (CA)

(73) Assignee: Sanctuary Cognitive Systems Corporation, Vancouver (CA)

( * ) Notice: Subject to any disclaimer, the term of this patent is extended or adjusted under 35 U.S.C. 154(b) by 767 days.

This patent is subject to a terminal disclaimer.

(21) Appl. No.: 17/491,583

(22) Filed: Oct. 1, 2021

(65) Prior Publication Data

US 2022/0105644 A1 Apr. 7, 2022

Related U.S. Application Data

(60) Provisional application No. 63/086,258, filed on Oct. 1, 2020.

(51) Int. Cl.
| | | |
|---|---|---|
| *B25J 15/08* | (2006.01) | |
| *B25J 15/00* | (2006.01) | |
| *B25J 15/10* | (2006.01) | |
| *H05K 1/02* | (2006.01) | |
| *H05K 1/03* | (2006.01) | |

(52) U.S. Cl.
CPC .......... *B25J 15/08* (2013.01); *B25J 15/0009* (2013.01); *B25J 15/0023* (2013.01); *B25J 15/10* (2013.01); *H05K 1/028* (2013.01); *H05K 1/0346* (2013.01); *H05K 1/0393* (2013.01); *H05K 2201/0154* (2013.01); *H05K 2201/10151* (2013.01)

(58) Field of Classification Search
CPC .... B25J 15/08; B25J 15/0009; B25J 15/0023; B25J 15/10; H05K 1/028; H05K 1/0346; H05K 1/0393; H05K 2201/0154; H05K 2201/10151
See application file for complete search history.

(56) References Cited

U.S. PATENT DOCUMENTS

| | | | |
|---|---|---|---|
| 10,894,325 B2* | 1/2021 | Bao ...................... | B25J 15/0009 |
| 2011/0163561 A1* | 7/2011 | Kim ........................ | B25J 9/104 |
| | | | 294/111 |
| 2014/0132018 A1* | 5/2014 | Claffee ................ | B25J 15/0475 |
| | | | 901/31 |

(Continued)

*Primary Examiner* — Stephen A Vu
(74) *Attorney, Agent, or Firm* — Thomas Mahon; Adenike Adebiyi

(57) ABSTRACT

A robotic end effector or end-of-arm tool may take the form of a mechanical digit (e.g., mechanical finger), or employ one or more mechanical digits (e.g., mechanical fingers), controllable in multiple degrees of freedom, e.g., pitch, yaw, curl. The mechanical digit(s) advantageously comprise a skeleton and three (3) piston/cylinders combinations, one controlling curl, and the other two controlling pitch and/or yaw. Mechanical digits may comprises a number of rolling contact joints. A flexible printed circuit board (PCB) carrying a variety of sensors covers the skeleton, and runs inside the rolling contact joints to provide a zero length change path. Knuckle imitators may cause a membrane cast or sheath joint to resemble human knuckles.

18 Claims, 14 Drawing Sheets

(56) References Cited

U.S. PATENT DOCUMENTS

2014/0132021 A1\* 5/2014 Claffee ................ B25J 15/103
901/31
2016/0121489 A1\* 5/2016 Moore .................... B25J 9/142
294/198

\* cited by examiner

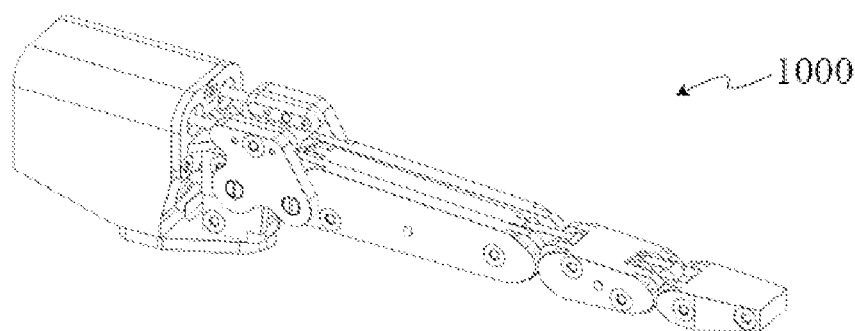
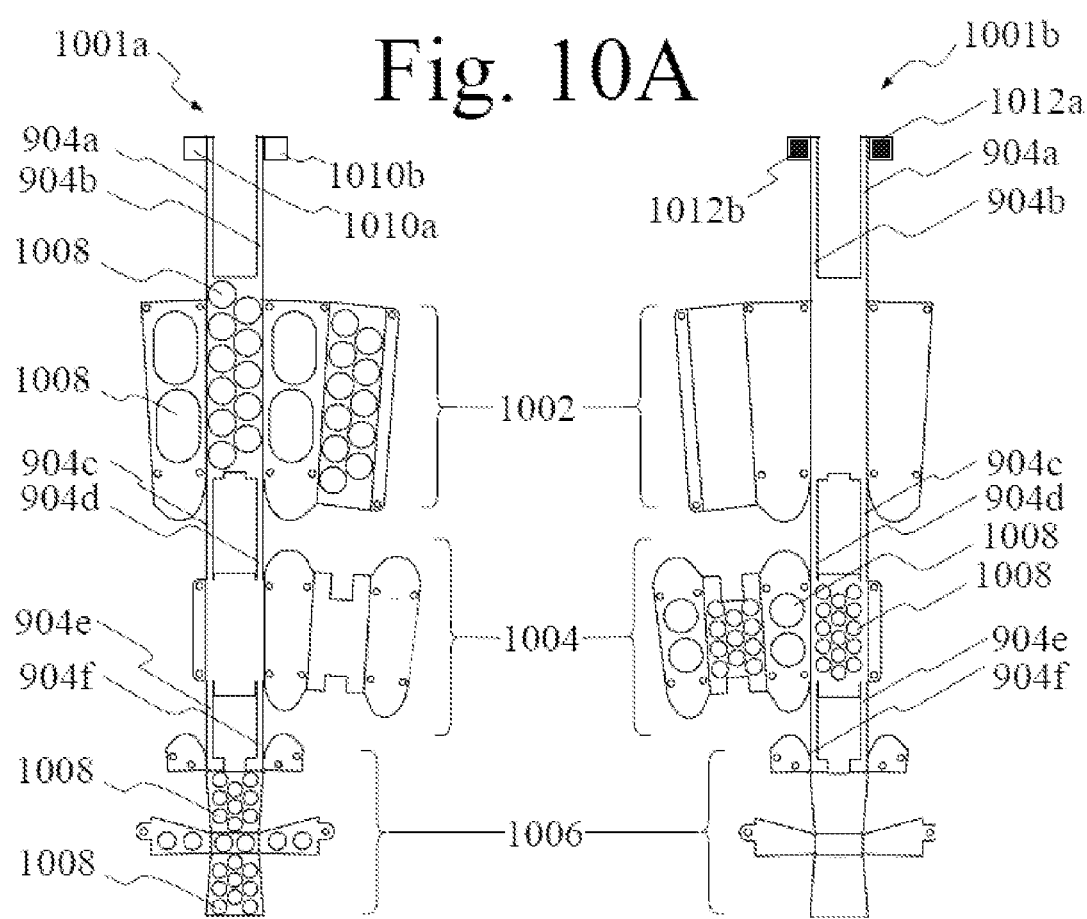
Fig. 10A
Fig. 10B  Fig. 10C

SYSTEMS, DEVICES, AND METHODS FOR ROBOTIC END EFFECTORS

TECHNICAL FIELD

The present systems, devices, and methods are generally related to robotics and more particularly to robot end effectors or end-of-arm tools and/or actuators, for example mechanical hands or mechanical hands with mechanical digits having multiple degrees of freedom.

BACKGROUND

Robots or robotic appendages typically employ an end-of-arm tool or end effector to interact with objects in an environment in which the robot operates. Some end-of-arm tools or end effectors are relatively simple articles, without moving elements (e.g., push bar, hook, suction cup) allowing simple interactions or engagement (e.g., push, pull, lift) with objects in the environment. Other end-of-arm tools or end effectors are relatively complex machines, with moving elements (e.g., grippers, digits) allowing complex interactions or engagement (e.g., grasping) with objects in the environment.

As the field of robots develops, more sophisticated and/or robust end-of-arm tools or end effectors are desirable.

SUMMARY

Described and illustrated herein are robot end effectors, end-of-arm tools and/or actuators that take the form of a mechanical digit (e.g., mechanical finger), or employ one or more mechanical digits (e.g., mechanical fingers), that can be controlled in three (3) degrees of freedom (pitch and yaw of a first ($1^{st}$) joint, and combined curl of a second ($2^{nd}$) joint and a third ($3^{rd}$) joint). The mechanical digit(s) advantageously comprise a skeleton and three (3) pistons and associated cylinders, one controlling the curl, and the other two controlling the pitch and/or yaw. One or more valves fluidly couple one or more sources of pressurized fluid (e.g., liquid for instance hydraulic fluid; gas for instance air) to the cylinders and are operable to control a pressure on one or both sides of the piston in the respective cylinder to cause the piston to translate with respect to the respective cylinder to set the position of the pistons to obtain a desired or directed amount of rotation about a curl axis, rotation about a pitch axis and/or rotation about a yaw axis. The pistons and cylinders may take the form of hydraulic piston and cylinder combinations, or alternatively take the form of pneumatic piston and cylinder combinations.

Each joint of the mechanical digit may advantageously be comprised or take the form of a rolling contact joint. There may also be a single sheet of flexible printed circuit board (PCB) carrying a variety of sensors that covers an outer surface of the skeleton, the flexible PCB advantageously running inside of the rolling contact joint (which provides a zero length change path for the flexible PCB through a full range of motion).

All three pistons and cylinders may be located in a base of the mechanical digit, or alternatively in a palm to which the mechanical digit is coupled. The curl degree of freedom may be transmitted through a set of gears and linkages. The skeleton may also include two knuckle imitators, each located at a respective one of the curl joints, and which extend past the curl joints to provide a shape similar to a human finger knuckle when a flexible, resilient skin (e.g., silicone membrane) is cast around the skeleton or when a silicone skin glove or sheath is placed around the skeleton.

A mechanical digit may be summarized as including: a base; a first phalanx; a first rolling surface joint that rotationally mechanically couples the first phalanx to the base for rotation about one or more axes; a second phalanx; a second rolling surface joint that rotationally mechanically couples the second phalanx to the first phalanx for rotation about one or more axes; a third phalanx; a third rolling surface joint that rotationally mechanically couples the third phalanx to the second phalanx for rotation about one or more axes; and a flexible printed circuit board that extends between the base and the third phalanx and which wraps partially about each of the first rolling surface joint, the second rolling surface joint, and the third rolling surface joint.

The flexible printed circuit board may: extend in a first rotational directional about a portion of a distal end of the first phalanx, extend in a second rotational direction about a portion of a proximate end of the second phalanx, extend in the second rotational direction about a portion of a distal end of the second phalanx, and extend in the first rotational direction about a portion of a proximal end of the third phalanx. The first rotational direction may be opposite the second rotational direction. The first rotational direction and the second rotational direction may each be respectively one of clockwise and counterclockwise. The flexible printed circuit board may extend in the first rotational direction about a portion of a proximal end of the first phalanx. The flexible printed circuit board may extend in the first rotational direction about a portion of a distal end of the third phalanx.

The first rolling surface joint may rotationally mechanically couple the first phalanx to the base for rotation about a pitch axis. The second rolling surface joint may rotationally mechanically couple the second phalanx to the first phalanx for rotation about a first curl axis. Third rolling surface joint may rotationally mechanically couple the third phalanx to the second phalanx for rotation about a second curl axis.

The flexible printed circuit board may run inside of the first rolling surface joint, the second rolling surface joint, and the third rolling surface joint to provide a zero length change path for the flexible printed circuit board through a range of motion of the first mechanical digit about a yaw axis, the flexible printed circuit board having an amount of slack therein at least proximate the first base. The first rolling surface joint may comprise a first rolling surface of the first base and a second rolling surface of the first phalanx; the flexible printed surface board may extend over the first rolling surface of the first base and the second rolling surface of the first phalanx; and respective surface curvatures of the first rolling surface of the first base and the second rolling surface of the first phalanx may be respectively shaped relative to the pitch axis to ensure there is no length change in a path of the flexible printed circuit board when the first phalanx transitions into and between a neutral pose, a pitched-up pose, and a pitched-down pose.

The mechanical digit may further include a pin joint that pivotally mechanically couples the first phalanx to the base for rotation about a yaw axis.

The mechanical digit may further include at least one sensor physically and communicatively coupled to the flexible printed circuit board. The at least one sensor may be selected from a group consisting of: a tactile sensor, a force sensor, and a pressure sensor.

The flexible printed circuit board may comprise polyimide material and a plurality of communicative electrical lines.

The flexible printed circuit board may comprise a plurality of panels that fold around respective edges of the first phalanx, the second phalanx, and the third phalanx to cover a majority of respective external surface areas of the first phalanx, the second phalanx, and the third phalanx.

The base may include an electrical connector port electrically coupled to the flexible printed circuit board. The mechanical digit may further include a yaw slack flexible printed circuit board that electrically connects between the electrical connector port and the flexible printed circuit board.

BRIEF DESCRIPTION OF THE DRAWINGS

In the drawings, identical reference numbers identify similar elements or acts. The sizes and relative states of elements in the drawings are not necessarily drawn to scale. For example, the positions of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 10A is a front, top, right side isometric view of the robotic mechanical digit of FIG. 1 with a flexible printed circuit board (PCB) omitted to better illustrate various joints, according to the present systems, devices, and methods.

FIG. 10B is a plan view of a first side of a flexible printed circuit board (PCB) of the robotic mechanical digit of FIG. 1, the flexible PCB illustrated in a flattened configuration, according to the present systems, devices, and methods.

FIG. 10C is a plan view of a second side of a flexible printed circuit board (PCB) of the robotic mechanical digit of FIG. 1, the second side opposite the first side across a thickness of the flexible PCB, the flexible PCB illustrated in a flattened configuration, according to the present systems, devices, and methods.

DETAILED DESCRIPTION

In the following description, certain specific details are set forth in order to provide a thorough understanding of various disclosed implementations and embodiments. However, one skilled in the relevant art will recognize that implementations and embodiments may be practiced without one or more of these specific details, or with other methods, components, materials, etc. In other instances, certain structures associated with robots, robotic appendages, linkages, valves, cables or actuators, reservoirs of pressurized fluid (e.g., liquid, gas), and/or compressors, have not been shown or described in detail to avoid unnecessarily obscuring descriptions of the implementations or embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1:
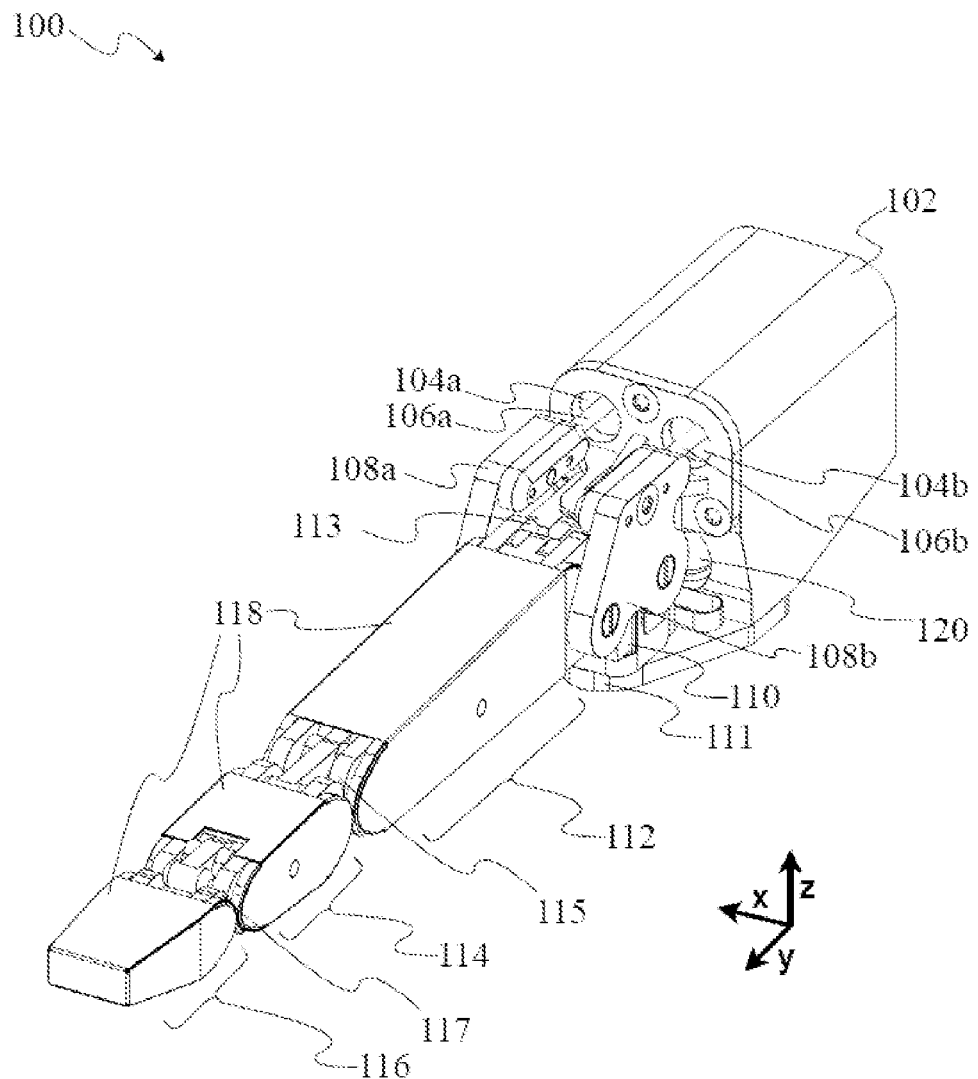
FIG. 1 is a front, top, left side isometric view of a robotic mechanical digit in a straight or neutral pose and without a membrane or artificial skin, according to the present systems, devices, and methods.
Figure 2:
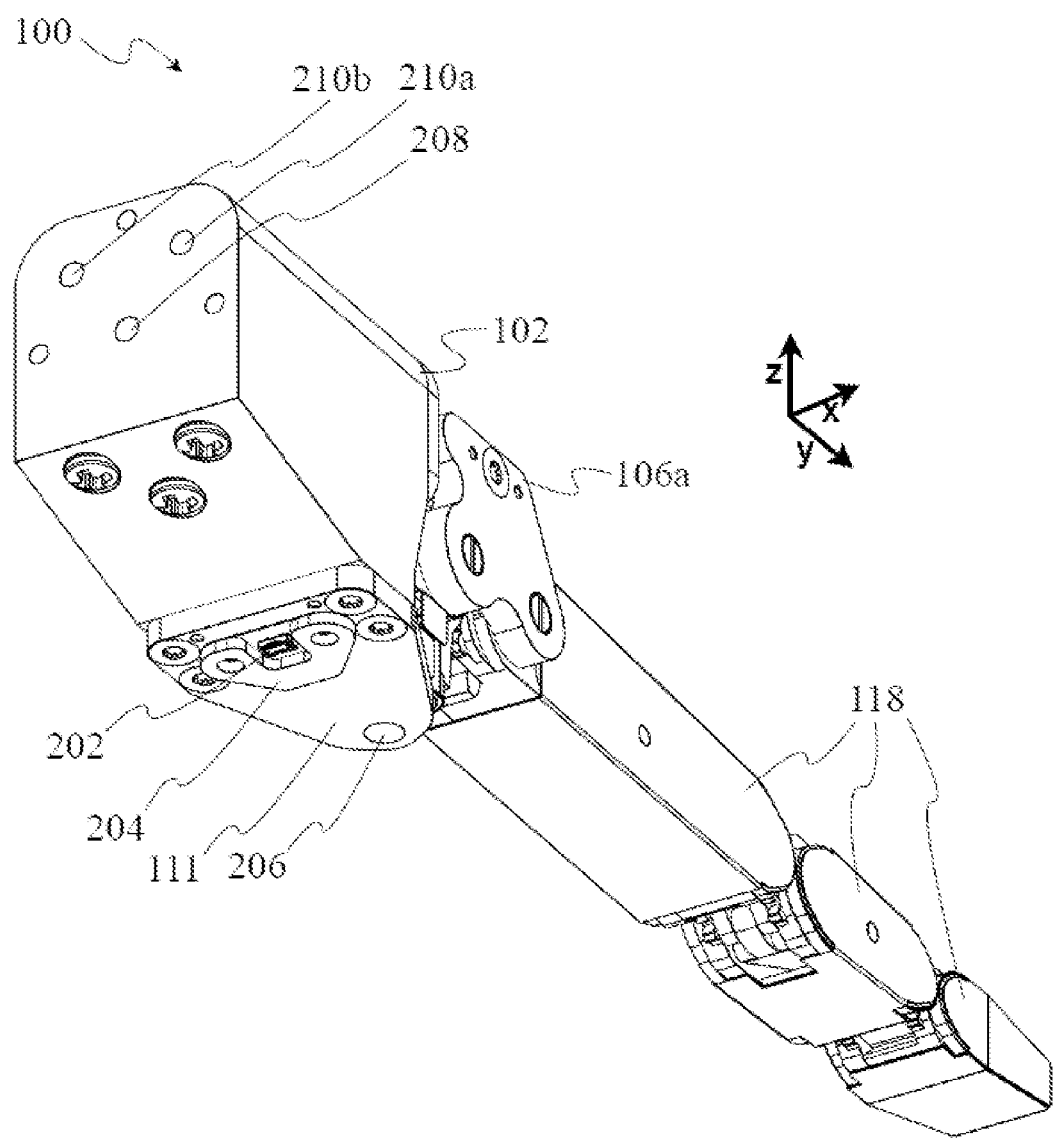
FIG. 2 is a rear, bottom, right side isometric view of the robotic mechanical digit of FIG. 1 in the straight or neutral pose, according to the present systems, devices, and methods.
Figure 3:
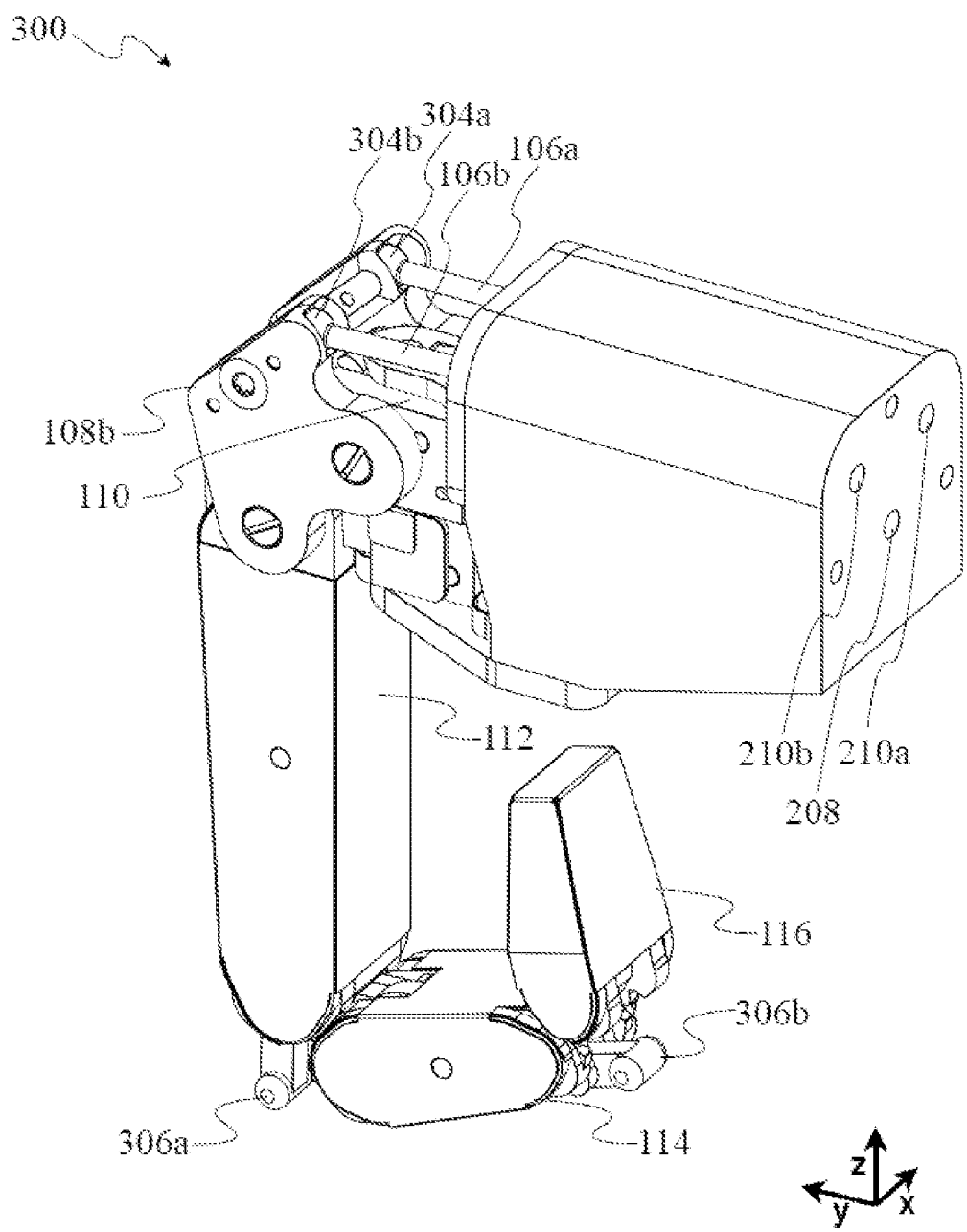
FIG. 3 is a top, rear, left side isometric view of a robotic mechanical digit of FIG. 1 in a full curl and pitch down pose, according to the present systems, devices, and methods.

FIGS. 1, 2 and 3 show an example of a robotic mechanical digit 100, according to the present systems, devices, and methods. In particular, FIG. 1 shows a front, top, left side isometric view of robotic mechanical digit 100 in a straight or neutral pose and without any membrane or artificial skin, which may be included in some implementations; FIG. 2 shows a rear, bottom, right side isometric view of robotic mechanical digit 100 in the straight or neutral pose and without any membrane or artificial skin; and FIG. 3 shows a top, rear, left side isometric view of robotic mechanical digit 100 in a full curl and pitch down pose, according to the present systems, devices, and methods.

Robotic mechanical digit 100 comprises skeleton that includes a base 102. The base 102 may have one or more mechanical coupling or attachment points or features that allow attachment to a palm or similar robotic structure, which may or may not be analogous to a human hand. The base 102 includes a right cylinder 104a and a left cylinder 104b, where "right" and "left" respectively correspond to first and second lateral sides of a centerline that passes longitudinally through mechanical digit (i.e., though base 102, first phalanx 112, second phalanx 114, and third phalanx 114) along the y-axis of FIG. 1. A right piston rod 106a and a left piston rod 106b are partially within, and extend outwardly from, the left and right cylinders 104a and 104b respectively. Coupled to a second end of the right piston rod 106a is a right pitch-yaw linkage 108a, and coupled to a second end of the left piston 106b is a left pitch-yaw linkage 108b. Additional details of the inside of the left and right cylinders and their couplings are visible in FIGS. 6, 7, and 9. The right and left pitch-yaw linkages 108a, 108b are rotatably coupled to opposite sides of a yaw carriage 110 which is rotatably coupled around a z-axis to a bottom plate 111 which is fixed to the base 102. Also rotatably coupled to the right and left pitch-yaw linkages 108a, 108b is the first phalanx 112 at a first end of the first phalanx 112. Also rotatably coupled near the first end of the first phalanx 112 is the yaw carriage 110 by a first rolling surface joint 113. Additional details of the pitch-yaw linkages 108a, 108b and yaw carriage couplings and their locations are visible in FIGS. 3 and 9. The first phalanx 112 is coupled at a second end to a first end of a second phalanx 114 by a second rolling surface joint 115 as illustrated in FIGS. 5A-5D. Similarly, the second phalanx 114 is coupled at a second end thereof to a first end of a third phalanx 116 by a third rolling surface joint 117. The first, second, and third phalanges 112, 114, 116, and their rolling surface joints 113, 115, and 117 (respectively), are illustrated in FIGS. 5A-5D and 6. Woven into the rolling surface joints and coupled to the phalanges is a first flexible printed circuit board (flexPCB) 118 which, in this implementation, is electrically and mechanically coupled to the yaw carriage 110 (as visible in FIGS. 13A and 13B) and then woven through the rolling surface joints 113, 115, and 117 of the phalanges 112, 114, and 116, and fixed to the third phalanx 116 (as visible in FIGS. 5A-5D). The first flexPCB 118 also comprises a set of folding faces that cover the sides of the phalanges 112, 114, and 116. More details of the first flexPCB 118, the path of the first flexPCB 118, and the mechanical and electrical couplings of the first flexPCB 118 are visible in FIGS. 5A, 9A, 9B, 9C, 10B, and 100. The first flexPCB 118 may also include or electrically couple to a set of tactile sensors, which are not illustrated in FIGS. 1, 2 and 3 but are illustrated in FIGS. 10B and 100. Finally, a bottom cylinder 120 sits within the base (more detail visible in FIG. 6).

Figure 6:
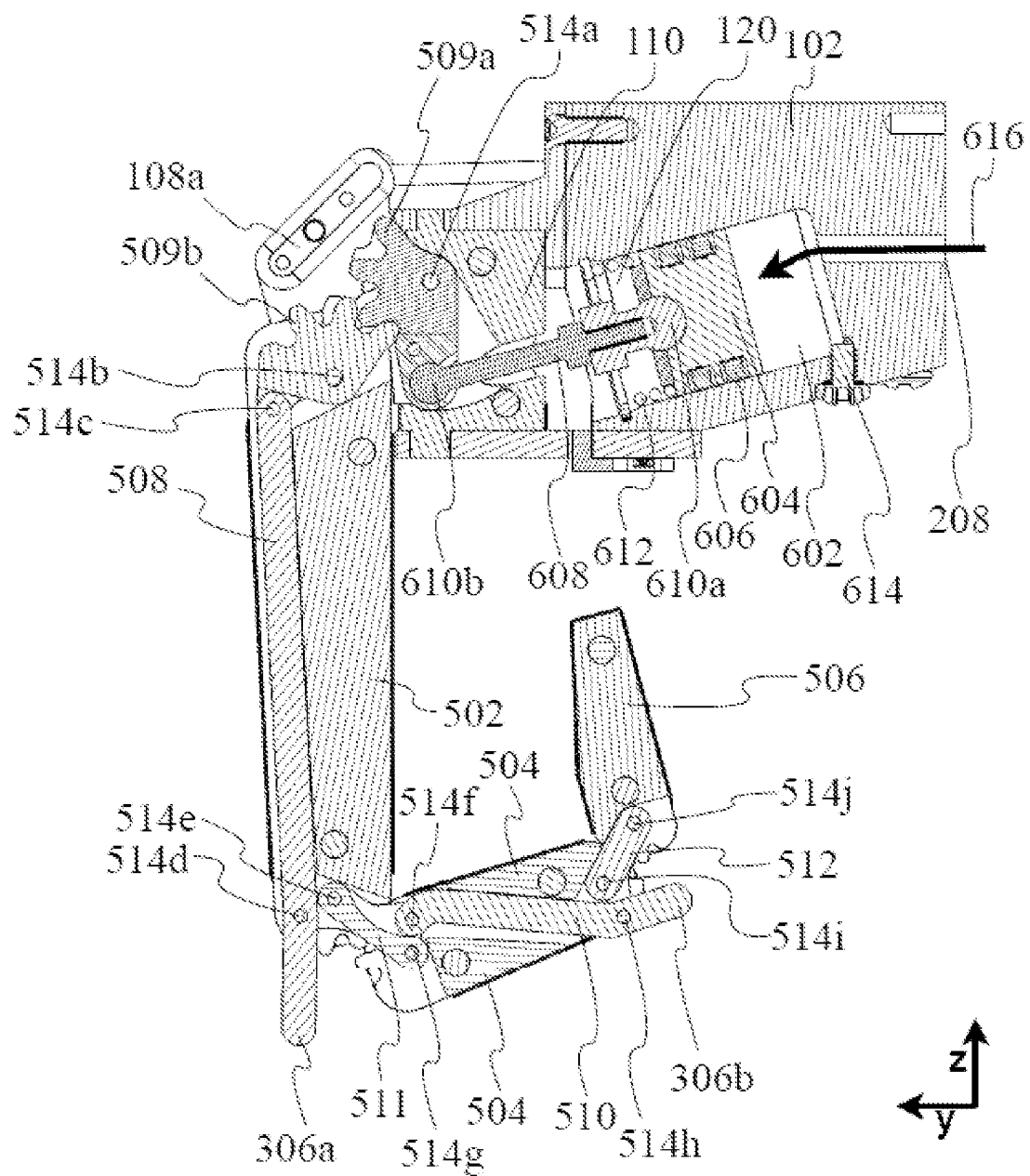
FIG. 6 is a cross-sectional view of the robotic mechanical digit of FIG. 1 in the fully curled, pitch-down pose, the section along the fourth plane 408 (FIG. 4A), according to the present systems, devices, and methods.
Figure 7:
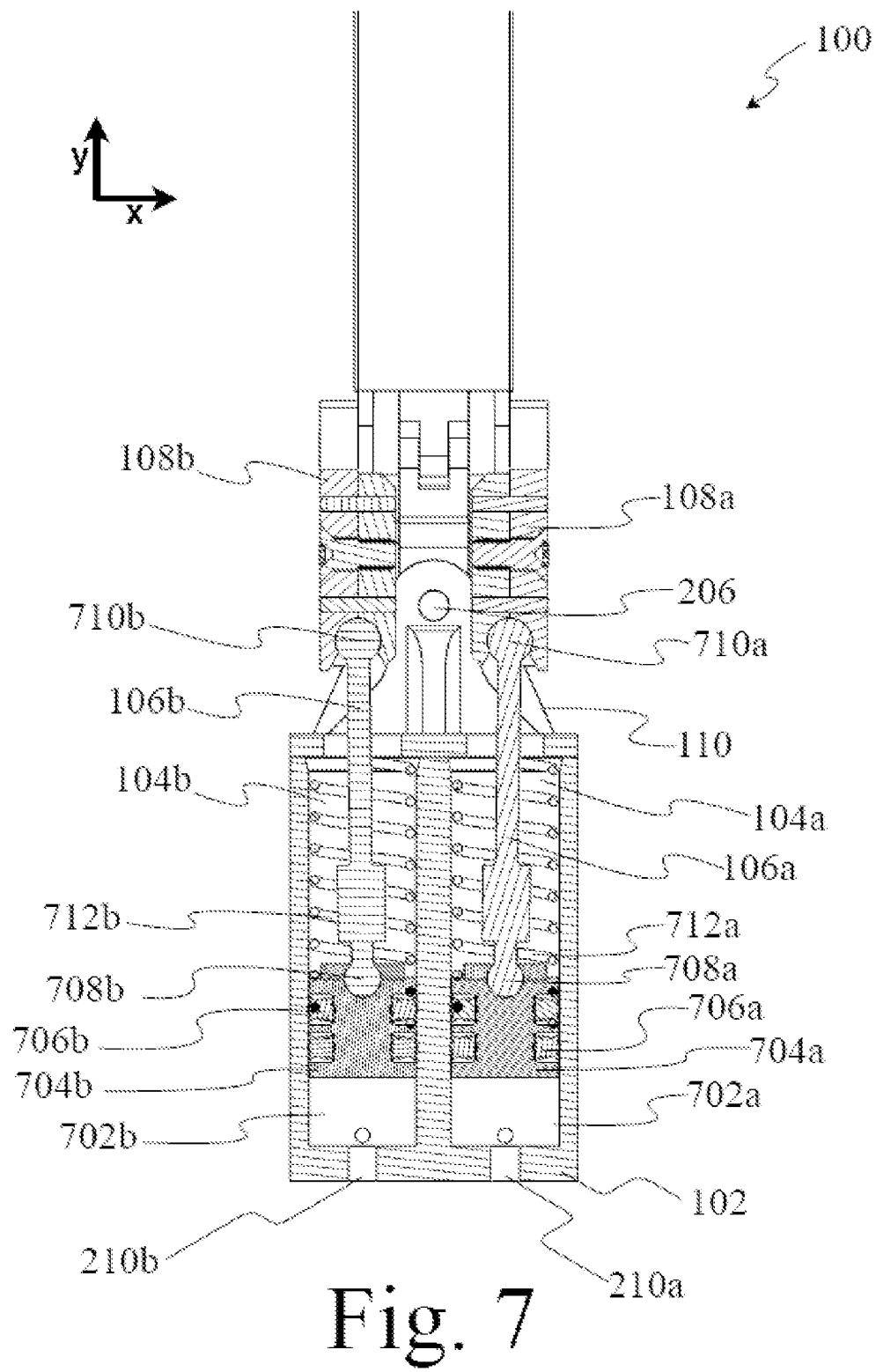
FIG. 7 is a cross-sectional view of a portion of the robotic mechanical digit of FIG. 1 in the straight or neutral pose taken along a sixth plane 412 (FIG. 4B), according to the present systems, devices, and methods.

As illustrated in FIG. 2, an electrical connector port 202 may be provided that electrically connects to flexPCB 118 and allows flexPCB 118 to be electrically coupled to a palm or similar robotic structure. The electrical connector port 202 is held in place by a retaining piece 204 fixed to the bottom plate 111 to which the yaw carriage 110 is rotatably coupled at pin joint 206. Furthermore, in the illustrated implementation base 102 comprises a fluid manifold (e.g., a hydraulic manifold) including a volume that contains at least respective portions of the right cylinder 104a, the left cylinder 104b, and the bottom cylinder 120 and fluid ports and/or valves for the three cylinders: a bottom cylinder fluid port 208 that provides a fluidly communicative path from a source of pressurized fluid (e.g., hydraulic or pneumatic fluid) to bottom cylinder 120 (FIG. 6), a right cylinder fluid port 210a that provides a fluidly communicative path from a source of pressurized fluid (which may be the same source of pressurized fluid that is fluidly communicatively coupled to bottom cylinder 120 by port 208, or which may be a separate source of pressurized fluid) to right cylinder 104a (FIG. 7), and a left cylinder fluid port 210b that provides a fluidly communicative path from a source (again, a same source or a different source) of pressurized fluid to left cylinder 104b (FIG. 7). One or more hydraulic or pneumatic fluid conduit(s) may be coupled to the fluid ports 208, 210a, 210b in order to supply varying pressures of a hydraulic or pneumatic fluid to control a position of pistons within the respective cylinders 120, 104a, 104b.

As noted above, FIG. 3 shows the robotic mechanical digit 100 in a full curl and pitch down pose 300. FIG. 3 also clearly shows a right spherical or ball joint 304a coupling the right piston rod 106a to the right pitch-yaw linkage 108a and a left spherical or ball joint 304b coupling the left piston rod 106b to the left pitch-yaw linkage 108b. Right spherical or ball joint 304a is directly attached to right piston rod 106a and left spherical or ball joint 304b is directly attached to left piston rod 106b. Also visible due to the curled pose are a first knuckle 306a and a second knuckle 306b, both of which protrude in order to, when covered by a stretchable artificial skin layer, simulate the external shape of a human knuckle bone. More details of the mechanics of the first and second knuckles 306a, 306b are illustrated in FIG. 5C, FIG. 5D, and FIG. 6.

In FIG. 3, robotic mechanical digit 100 is in a fully pitched down pose, meaning that the first phalanx 112 has pitched down forward (e.g., counterclockwise around a "pitch axis" or x-axis in the view of FIG. 3) such that its longitudinal axis points in a direction of a z-axis. This is caused by a simultaneous actuation of a right and left piston 106a, 106b sitting within the right and left cylinders 104a, 104b. This action is further illustrated in FIGS. 9A, 9B, and 9C. Similarly, the curling of the second and third phalanges 114, 116 in this pose is due to the actuation of a bottom piston 604 within the bottom cylinder 120 as illustrated in FIG. 6.

Figures 4A, 4B:
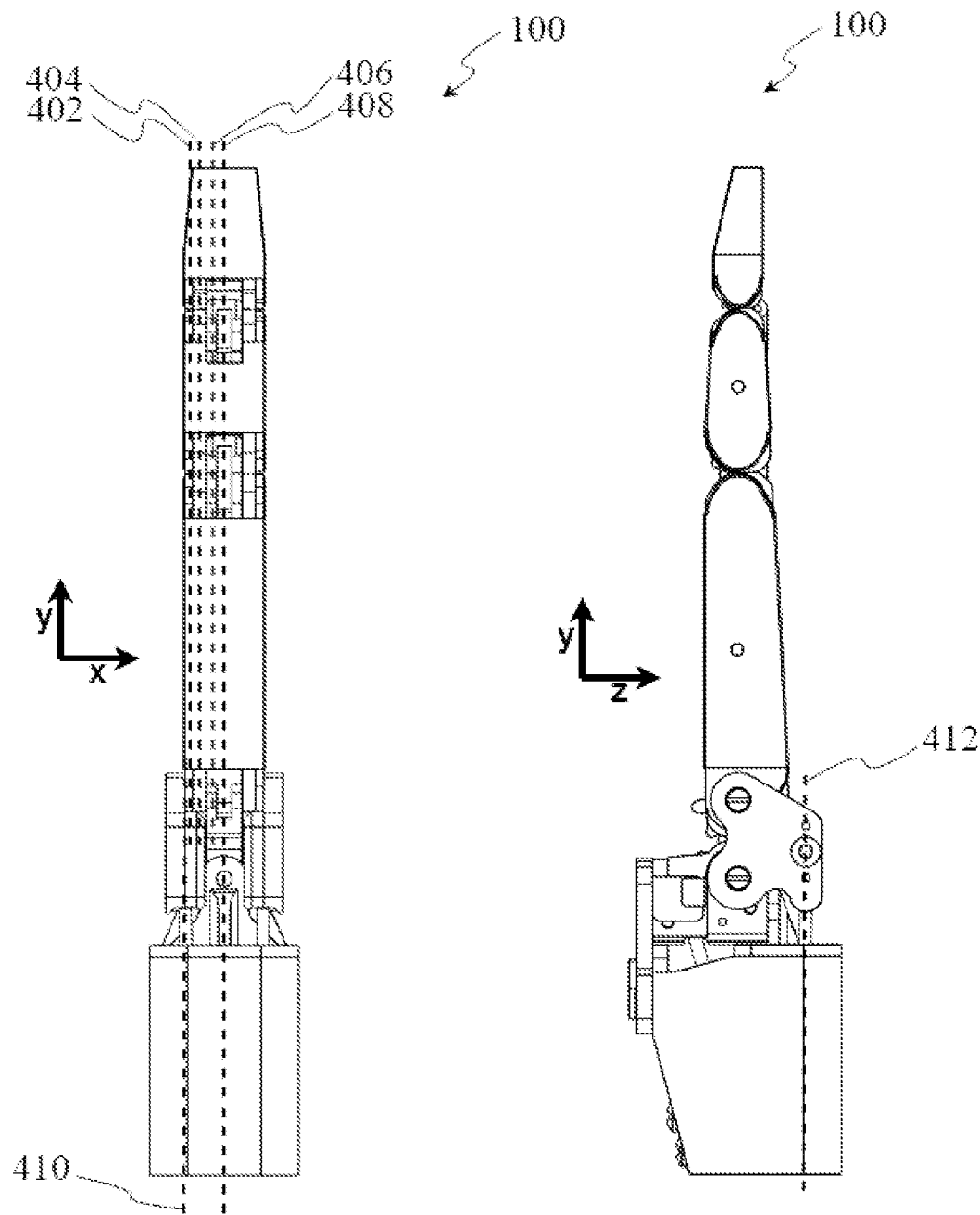
FIG. 4A is a top plan view of the robotic mechanical digit of FIG. 1 in the straight or neutral pose, according to the present systems, devices, and methods.
FIG. 4B is a left side elevational view of the robotic mechanical digit of FIG. 1 in the straight or neutral pose, according to the present systems, devices, and methods.
Figure 9A:
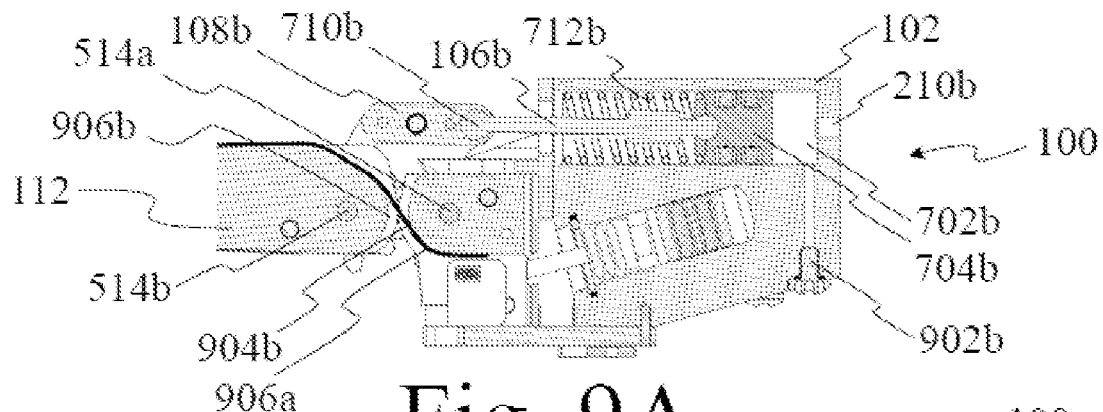
FIG. 9A is a cross-sectional view of a portion of the robotic mechanical digit of FIG. 1 in a straight or neutral pose, the section taken along a fifth plane, according to the present systems, devices, and methods.
Figure 9B:
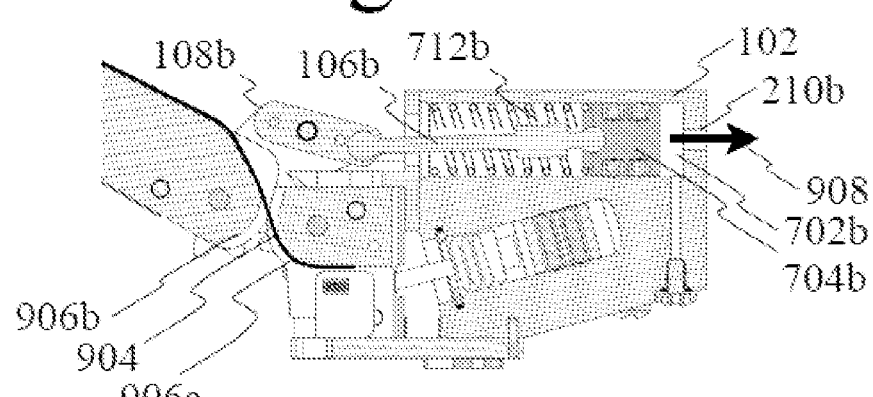
FIG. 9B is a cross-sectional view of a portion of the robotic mechanical digit of FIG. 1 in a pitched-up pose rotated counterclockwise about a pitch axis, the section taken along the fifth plane, according to the present systems, devices, and methods.
Figure 9C:
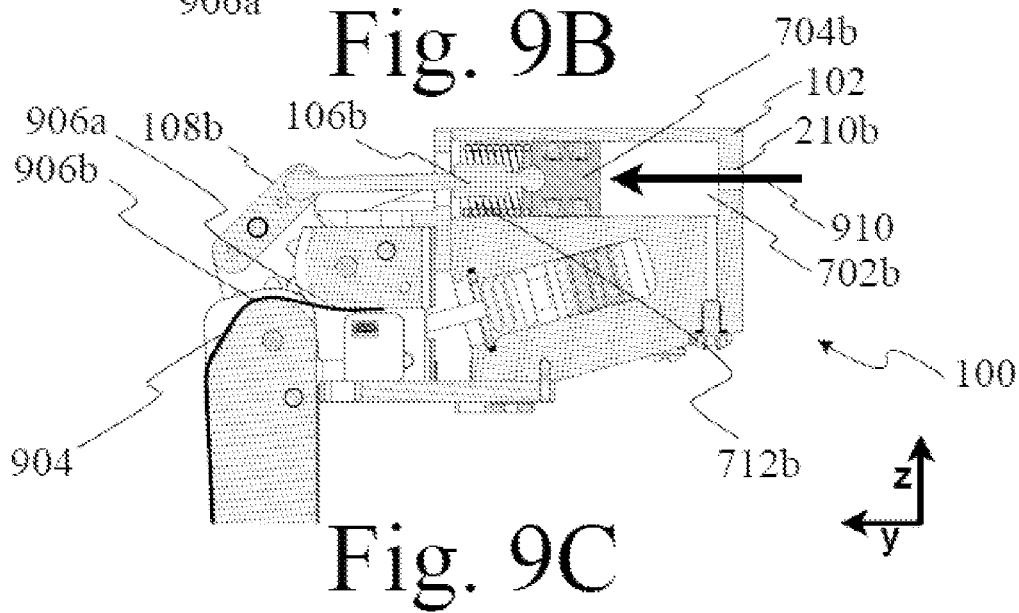
FIG. 9C is a cross-sectional view of a portion of the robotic mechanical digit of FIG. 1 in a pitched-down pose rotated clockwise about the pitch axis, the section taken along the fifth plane, according to the present systems, devices, and methods.

FIG. 4A shows robotic mechanical digit 100 in the straight or neutral pose. Shown by broken lines are a first plane 402, a second plane 404, a third plane 406, and a fourth plane 408, all parallel to a yz-plane. The planes 402, 404, 406, and 408 are at different depths from the left side (per the view of FIG. 4A) of robotic mechanical digit 100 and a left section view at each of planes 402, 404, 406, and 408 is shown in FIGS. 5A, 5B, 5C, and 5D, respectively. The fourth plane 408 is positioned at the center of mechanical digit 100 and a left section view at this plane is also shown in FIG. 6. Similarly, a fifth plane 410 is shown by a broken line, and is also parallel to the yz-plane. The fifth plane 410 is positioned such that a center of the left cylinder 104b sits on said plane. A left section view at the fifth plane 410 is shown in FIGS. 9A, 9B, and 9C.

Figure 8:
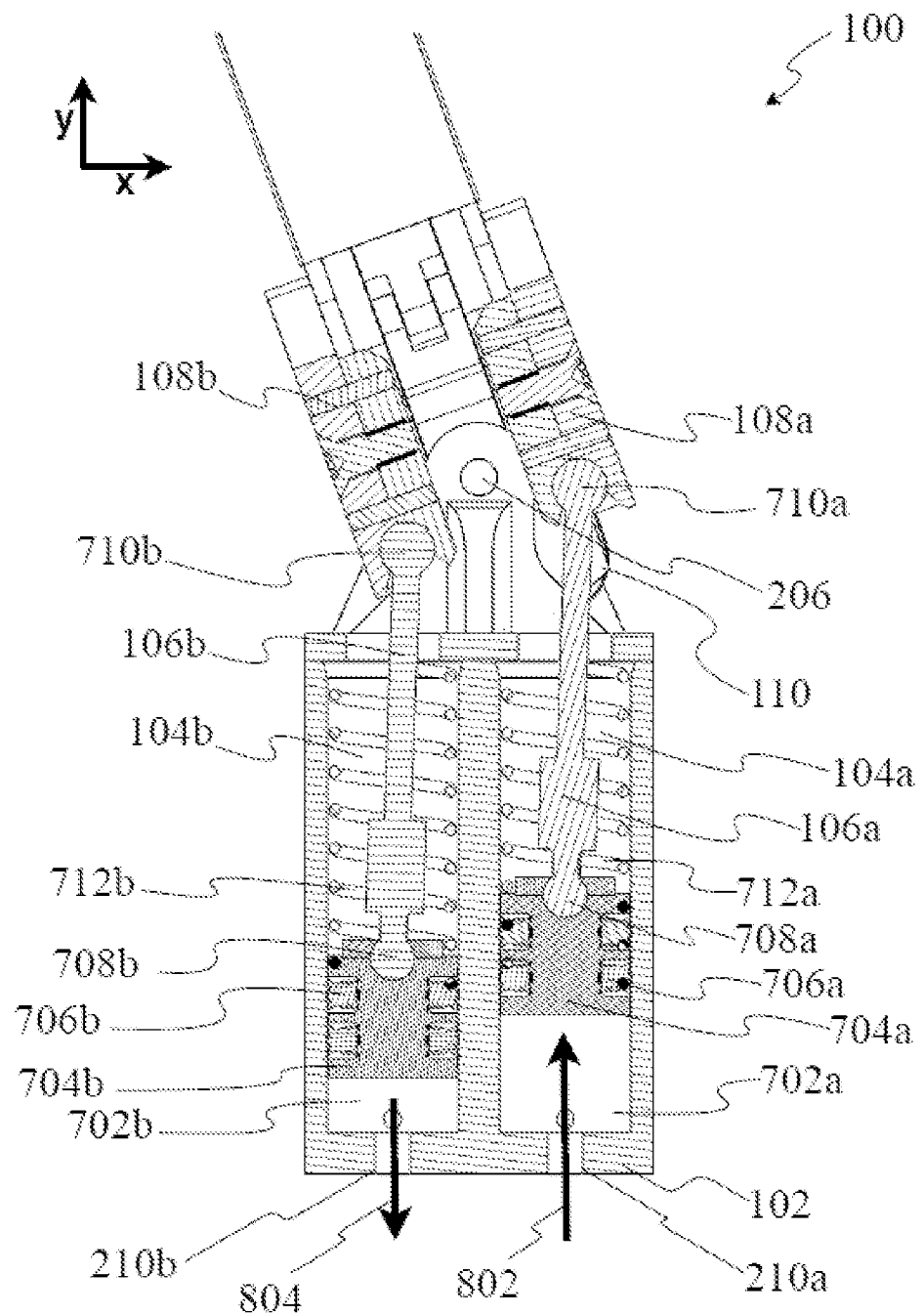
FIG. 8 is a cross-sectional view of a portion of the robotic mechanical digit of FIG. 1 in a pose with a rotation counterclockwise about a yaw axis, the section taken along a sixth plane 412 (FIG. 4B), according to the present systems, devices, and methods.

FIG. 4B shows robotic mechanical digit 100 in the straight or neutral pose. Shown by a broken line is a sixth plane 412 parallel to the yx-plane and positioned such that respective centers of both the right cylinder 104a and left cylinder 104b are on the sixth plane 412. Cross sectional views at the sixth plane 412 are shown in FIGS. 7 and 8.

FIGS. 5A, 5B, 5C, and 5D show robotic mechanical digit 100 with section cuts at planes 402, 404, 406, and 408 respectively. Visible in FIGS. 5A, 5B, 5C, and 5D are a set of rolling surfaces 501a, 501b, 501c, 501d, 501e, 501f (collectively either 501a-501f or 501), a first phalanx body 502, a second phalanx body 504, and a third phalanx body 506, a set of phalangeal gears 507a, 507b, 507c, 507d, 507e, 507f (collectively either 507a-507f or 507), a first phalanx link 508, a second phalanx link 510, a first curl link 511, a second curl link 512, a set of pin joints 514a-j, a first curl gear 516a, and a second curl gear 516b. Each of the phalanx bodies 502, 504, and 506, the links 508, 510, 511, and 512, and each of the gears 516a and 516b is symmetrical across the yz-plane, and all features and connections described in FIGS. 5A, 5B, 5C, and 5D are also present on a right side of mechanical digit 100.

Figure 5A:
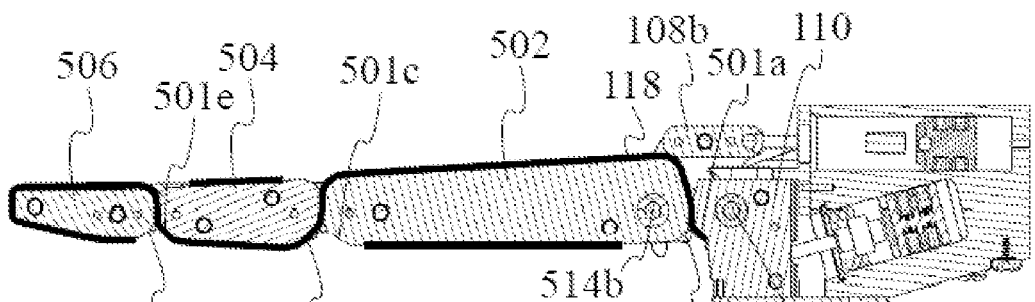
FIG. 5A is a cross-sectional view of the robotic mechanical digit of FIG. 1 in the straight or neutral pose taken along a first plane 402 (FIG. 4A), according to the present systems, devices, and methods.
Figure 5B:
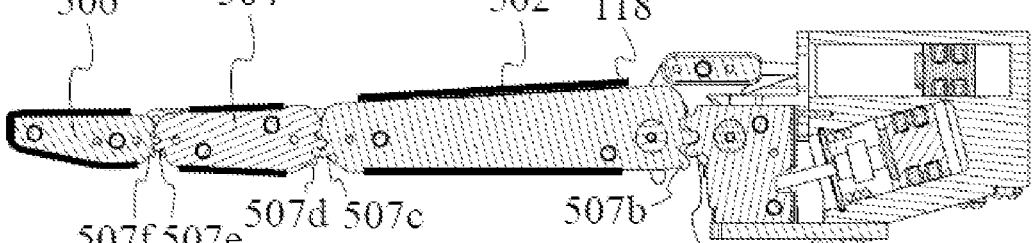
FIG. 5B is a cross-sectional view of the robotic mechanical digit of FIG. 1 in the straight or neutral pose, the section taken along a second plane 404 (FIG. 4A), according to the present systems, devices, and methods.
Figure 5C:
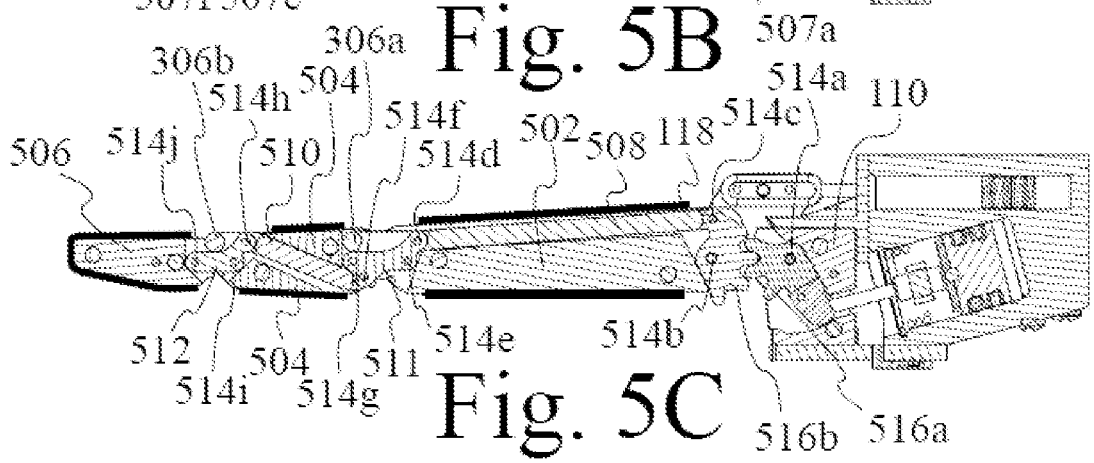
FIG. 5C is a cross-sectional view of the robotic mechanical digit of FIG. 1 in the straight or neutral pose, the section along a third plane 406 (FIG. 4A), according to the present systems, devices, and methods.
Figure 5D:
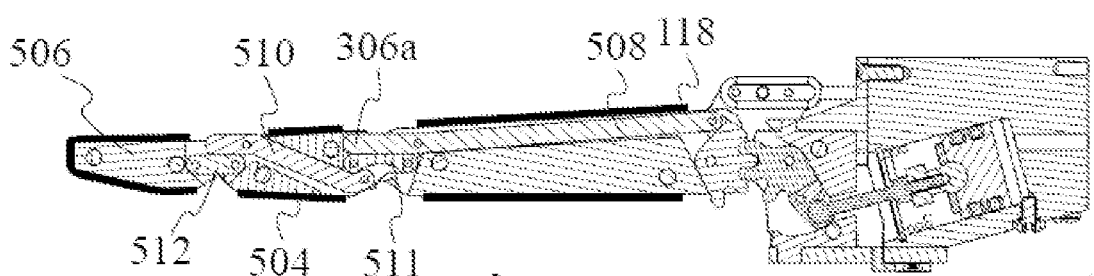
FIG. 5D is a cross-sectional view of the robotic mechanical digit of FIG. 1 in the straight or neutral pose, the section along a fourth plane 408 (FIG. 4A), according to the present systems, devices, and methods.

As visible in FIG. 5A, the flexPCB 118 (illustrated in FIGS. 5A, 5B, 5C, and 5D with a thick black line; for a planar view of the unfolded PCB, see FIGS. 10B and 100) is coupled to the yaw carrier 110 at one end, threads between rolling surfaces 501a and 501b to a top of the first phalanx body 502, threads between rolling surfaces 501c and 501d to a bottom of the second phalanx body 504, threads between rolling surfaces 501e and 501f to a top of the third phalanx body 506, wraps around a tip of the third phalanx body 506 and is fixed to the third phalanx body 506 at a bottom thereof. The rolling surfaces 501a and 501b form the first rolling surface joint 113, the rolling surfaces 501c and 501d form the second rolling surface joint 115, and rolling surfaces 501e and 501f form the third rolling surface joint 117. The flexPCB 118 also includes paneling or wings that wraps or wrap around the sides of the first, second, and third phalanges. The paneling or wings are illustrated in FIGS. 10B and 100.

The pin joint 514a rotatably couples together the right and left pitch-yaw linkages 108a, 108b, the first curl gear 516a, and the yaw carriage 110. The pin joint 514b rotatably couples together the right and left pitch-yaw linkages 108a, 108b, the second curl gear 516b, and the first phalanx body 502. The pin joint 514c rotatably couples together the second curl gear 516b and the first phalanx link 508. The pin joint 514d rotatably couples together the first curl link 511 and the first phalanx link 508. The pin joint 514e rotatably couples together the first curl link 511 and the first phalanx body 502. The pin joint 514f rotatably couples together the second phalanx link 510 and the first curl link 511. The pin joint 514g rotatably couples together the second phalanx body 504 and the first curl link 511. The pin joint 514h rotatably couples together the second phalanx link 510 and the second curl link 512. The pin joint 514i rotatably couples together the second phalanx body 504 and the second curl link 512. The pin joint 514j rotatably couples together the third phalanx body 506 and the second curl link 512.

The rolling surfaces 501a, 501b, 501c, 501d, 501e, and 501f each have respective profiles defined by arcs centered on pin joints 514a, 514b, 514e, 514g, 514i, and 514j respectively. Rolling surfaces 501a and 501b, rolling surfaces 501c and 501d, and rolling surfaces 501e and 501f, form respective pairs of rolling surfaces having, for example, equal radii. In the illustrated implementations, the radii are equal to half of the distance between their centers less a thickness of the flexPCB 118 such that, with the flexPCB 118 between them, the rolling surfaces can roll against one another without slippage or a change in length of the flexPCB 118. Spaced inwardly from each of the rolling surfaces 501a-501f is a respective phalangeal gear 507a-507f centered at a respective pin joint. Phalangeal gears 507a and 507b, 507c and 507d, and 507e and 507f form respective pairs of gears having, for example, equal pitch circle radii and pitches, and each pair of gears is engaged with one another. Similarly, the first curl gear 516a and the second curl gear 516b have, for example, equal pitch circle radii and pitches, and are engaged with one another. Due to all of the above mechanical couplings, when the first curl gear is actuated such that it rotates clockwise (from the point of view of the left section view of FIGS. 5A, 5B, 5C, and 5D), the linkage created by the variety of links and gears curls the second and third phalange bodies 504, 506 counterclockwise around the x-axis. This actuation is functional regardless of the pitch of the first phalanx body 502 (as visible in FIGS. 9A, 9B, and 9C) due to the freedom of the second curl gear 516b to orbit around the first curl gear 516a without rotating relative to the first phalanx body 502.

FIG. 6 shows a sectional view along fourth plane 408 from FIG. 4A of robotic mechanical digit 100 in a fully curled, pitch-down pose. Visible in FIG. 6 are a back of the bottom cylinder 602, a bottom piston 604 slideably received by the bottom cylinder 602 for translation along a translation axis, and a set of O-Ring seals 606. Also shown are a bottom piston rod 608 directly coupled at a first end to the bottom piston 604 by a first spherical or ball joint 610a and at a second end to the first curl gear 509a by a second spherical or ball joint 610b, a spring 612 which sits within the bottom cylinder 120 and pushes on the bottom piston 604, and a bleed port 614. Illustrated as a dark arrow is the movement of a hydraulic fluid 616 (e.g., an oil, such as mineral oil or peanut oil) from an external source through the bottom port 208 into a back of the bottom cylinder 602. This fluid movement 616 applies a pressure on the bottom piston 604 and, assuming the pressure is greater than that applied by the spring 612 causes the bottom piston 604 to move within the bottom cylinder 120, pushing the bottom piston rod 608 forwards, causing the first curl gear 509a to rotate around its pin joint 514a, and actuating the rest of the curl mechanism as described above. When the movement of the fluid 616 is relieved, reversed, or otherwise changed, the force applied by the spring 612 may be sufficient to move the bottom piston 604 backwards into the cylinder 120, causing the curl mechanism to reverse. This reversed movement straightens the second and third phalanges 504, 506 with respect to the first phalanx 502. Due to the spherical or ball joints 610a, 610b at both connections of the bottom piston rod 608, this actuation is capable of proceeding regardless of the rotation of the yaw carriage 110 around the z-axis. While illustrated using a spring 612, some implementations may have ports to provide pressurized fluid at both a front and the back of the bottom cylinder 120, allowing omission of the spring 612, but somewhat complicating the overall structure and operation. The ports (e.g., 208, 614) may each have one or more valves associated therewith, for instance active valves that can be operated to selectively pass or block a passage of fluid therethrough, and/or passive valves, for instance check valves. The valve(s) may be positioned at the port(s) or remotely therefrom.

FIG. 7 shows a sectional view along sixth plane 412 from FIG. 4B of robotic mechanical digit 100 in the straight or neutral pose. Visible in FIG. 7 are a back of the right cylinder 702a, a right piston 704a slideably received by the right cylinder 702a for translation along a first translation axis, a set of right O-Ring seals 706a, the right piston rod 106a directly coupled at a first end to right piston 704a by a first right spherical or ball joint 708a and at a second end to the right pitch-yaw linkage 108a by a second right spherical or ball joint 710a, a right spring 712a which sits within the right cylinder 104a and pushes on the right piston 704a, a back of the left cylinder 702b, a left piston 704b slideably received by the left cylinder 702b for translation along a second translation axis, a set of left O-Ring seals 706b, the left piston rod 106b directly coupled at a first end to the left piston 704b by a first left spherical or ball joint 708b and at a second end to the left pitch-yaw linkage 108b by a second left or ball spherical joint 710b, and a left spring 712b which sits within the left cylinder 104b and pushes on the left piston 704b. Due to the spherical or ball joints on both sides of each of the right and left piston rods 106a, 106b, this actuation is capable of proceeding regardless of the rotation of the yaw carriage 110 around the z-axis. While illustrated using a spring 712a, 712b, some implementations may have ports to provide pressurized fluid at both a front and the back of the right and/or left cylinders 702a, 702b, allowing omission of the spring, but somewhat complicating the overall structure and operation. The ports may each have one or more valves associated therewith, for instance active valves that can be operated to selectively pass or block a passage of fluid therethrough, and/or passive valves, for instance check valves. The valve(s) may be positioned at the port(s) or remotely therefrom.

FIG. 8 shows the sectional view along sixth plane 412 from FIG. 7 with portions of robotic mechanical digit 100 rotated counterclockwise about a yaw (or "z") axis. This pose is actuated by a right fluid movement 802 (illustrated by a thick black arrow) moving from an external fluid reservoir through right fluid port 210a and into the back of the right cylinder 702a, and a left fluid movement 804 (illustrated by a thick black arrow) being expelled to an external fluid reservoir through left fluid port 210b. Fluid movements 802 and 804 cause equal but opposite movements of the left and right pistons 704a and 704b causing a rotation of the yaw carriage 110 (and the attached robotic digit) around the pin joint 206. The external fluid reservoir may comprise a source of fluid (e.g., liquid; gas), which may be pressurized, for instance via a compressor. One or more valves can be operated to control a flow, and direction of flow, of fluids.

FIGS. 9A, 9B, and 9C show respective sectional views along fifth plane 410 from FIG. 4A of various configurations of robotic mechanical digit 100. In FIG. 9A, robotic mechanical digit 100 is in a neutral pose, for instance at a neutral or default rotational position about a pitch axes. In FIG. 9B, robotic mechanical digit 100 is in a pitched-up pose, for instance rotated counterclockwise about the pitch axis in relation to the view of FIG. 9B. In FIG. 9C, the robotic mechanical digit 100 is in a pitched-down pose, for instance rotated clockwise about the pitch axis in relation to the view of FIG. 9C.

FIGS. 9A, 9B, and 9C also illustrate a left bleed port 902b, a first left connective strip 904b of the flexPCB 118 that travels between a first left flexPCB rolling surface 906a and a second left flexPCB rolling surface 906b.

As noted, robotic mechanical digit 100 is illustrated in a pitched-up pose in FIG. 9B relative to the neutral pose illustrated in FIG. 9A. The upward pitch results from (a) a fluid movement 908 out of the back of the left cylinder 702b through the left fluid port 210b, causing the left piston 704b to be pulled backwards (and/or pushed backwards by spring 712b) in a negative direction along the y-axis, which, due to the spherical or ball joints 708b, 710b coupling the left piston 704b to the left pitch-yaw linkage 108b, rotates the left pitch-yaw linkage 108b around pin joint 514a which in turn causes the orbit of the first phalanx 112 around the pin joint 514a and (b) an identical fluid movement in the right cylinder (not shown in FIG. 9B).

Also as noted, robotic mechanical digit 100 is illustrated in a pitched-down pose in FIG. 9C relative to the neutral pose illustrated in FIG. 9A. The downward pitch results from (a) a fluid movement 910 into the back of the left cylinder 702b through the left fluid port 210b, causing the left piston 704b to be pushed forwards in a positive direction along the y-axis, which, due to the spherical or ball joints 708b, 710b coupling the left piston 704b to the left pitch-yaw linkage 108b, rotates the left pitch-yaw linkage 108b around pin joint 514a which in turn causes the orbit of the first phalanx 112 around the pin joint 514a and (b) an identical fluid movement in the right cylinder (not shown in FIG. 9C).

As illustrated in FIGS. 9A, 9B, and 9C, the first left connective strip 904b travels between the yaw carriage 110 and the first phalanx 112 by extending between the first left flexPCB rolling surface 906a and the second left flexPCB rolling surface 906b, and transferring from one to the other through the change in pose. The first left connective strip 904b may be made of an easily bendable material, although not necessarily stretchable, for instance polyimide. The geometries and/or surface curvatures of the rolling surfaces 906a, 906b are compatibly designed such that there is no length change in the path the first left connective strip 904b takes when the first phalanx 112 shifts into and between the neutral pose of FIG. 9A, the pitched-up pose of FIG. 9B, and the pitched-down pose of FIG. 9C. Thus, the first left connective strip 904b advantageously does not experience any high longitudinal stress that may cause damage to the strip 904b, and only experiences a bending stress, which the bendable nature of the connective strip 904b is generally more able to accommodate without breaking.

FIG. 10A shows a robotic mechanical digit 1000 in a straight or neutral pose and without a membrane or artificial skin in accordance with the present systems, devices, and methods. Mechanical digit 1000 of FIG. 10A is substantially similar to mechanical digit 100 with the flexPCB 118 removed or omitted.

FIG. 10B shows a first side 1001a of a flattened flexPCB 1001 that may be used, for example, as flexPCB 118 in mechanical digit 100. FIG. 100 shows a second side 1001b of the flattened flexPCB 1001 of FIG. 10A, the second side opposite the first side. The flexPCB 1001 can attach to and be routed through the various pieces of mechanical digit 1000 to produce robotic mechanical digit 100, such as the flexPCB 118.

The flexPCB 1001 comprises the following, as shown in FIGS. 10B and 100: a set of connective strips (collectively 904) comprising a first right connective strip 904a, a first left connective strip 904b, a second right connective strip 904c, a second left connective strip 904d, a third right connective strip 904e, and a third left connective strip 904f. The first left and right connective strips 904a and 904b each connect (e.g., physically couple) at a first end of a first phalanx panel or wing 1002; the second left and right connective strips 904c and 904d each connect (e.g., physically couple) at and between a second end of the first phalanx panel or wing 1002 and a first end of a second phalanx panel or wing 1004; and the third left and right connective strips 904e and 904f each connect (e.g., physically couple) at and between a second end of the second phalanx panel or wing 1004 and a first end of a third phalanx panel or wing 1006. The connective strips 904 all carry power and communicative electrical lines to/from/between the various panels or wings 1002, 1004, 1006. Each of the phalanx panels or wings 1002, 1004, 1006 comprises a respective set of sub panels or sub-wings that, when folded around the edges of their respective digit phalanx (e.g., 112, 114, 116), cover the majority of the external surface area of the phalanx. Each of the phalanx panels or wings 1002, 1004, 1006 carries a plurality of tactile, force, or pressure sensors 1008 (only a few of which are indicated in the figures to reduce clutter). These sensors 1008 may be of a variety of sizes to achieve different tactile sensor densities at different parts of the digit 1000. Due to the fact that the connective strips 904 move through the inter-phalanx joints (as described in previous figures), the placement of the sensors 1008 alternates between the first side 1001a and the second side 1001b in order to always be pointing outwards on the surface of the digit 1000. The plurality of sensors 1008 electrically couple (optionally through an integrated circuit or microcontroller) to the electrical lines carried by the connective strips 904, which terminate at a set of connector pads 1010a and 1010b on which sit a set of mechanical and electrical couplers 1012a and 1012b respectively.

Figure 11A:
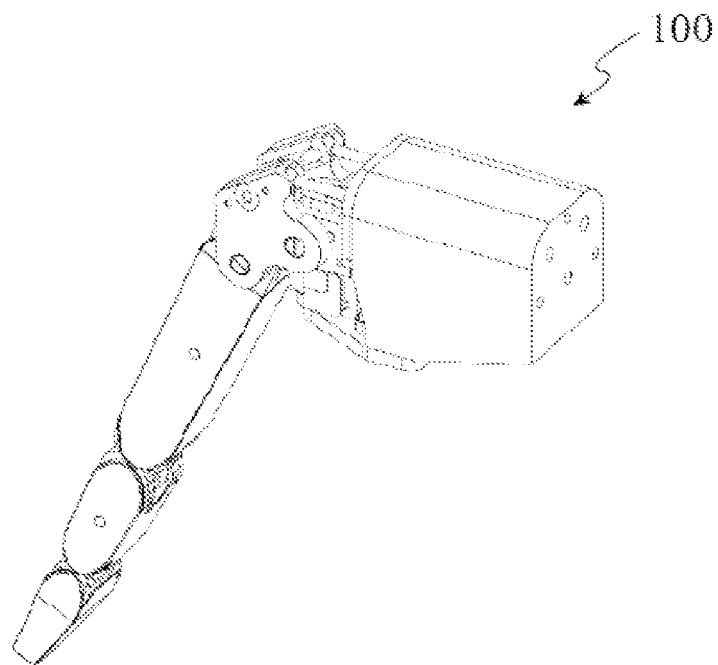
FIG. 11A is a top, left side, rear isometric view of the robotic mechanical digit of FIG. 1 in a pitched-down pose rotated counterclockwise about a pitch axis and actuated by an outward extension of both a right piston and a left piston, according to the present systems, devices, and methods.
Figure 11B:
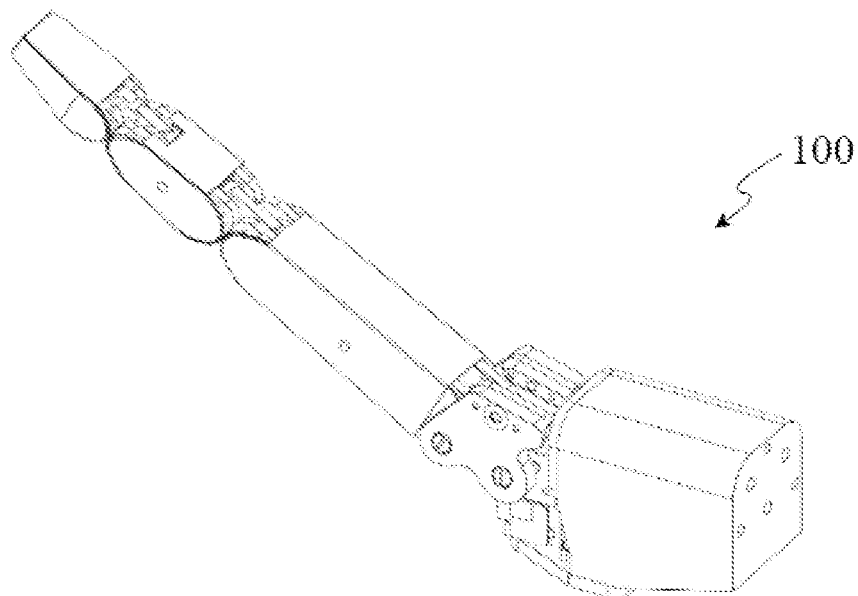
FIG. 11B is a top, left side, rear isometric view of the robotic mechanical digit of FIG. 1 in a pitched-up pose rotated clockwise about the pitch axis and actuated by an inward retraction of both the right piston and the left piston, according to the present systems, devices, and methods.

FIG. 11A shows robotic mechanical digit 100 in a pitched-down pose actuated by an extension (outward travel from a neutral position) of both the right and left pistons 106a, 106b in accordance with the present systems, devices, and methods. FIG. 11B shows robotic mechanical digit 100 in a pitched-up pose actuated by a retraction (inward travel from a neutral position) of the both right and left pistons 106a, 106b in accordance with the present systems, devices, and methods. Rotation about the pitch axis without rotation about the yaw axis is actuated by concurrent movements of the right piston 106a along its translation axis and the left piston 106b along its translation axis that are equal in speed, magnitude and direction with respect to one another along their respective translation axes. Conversely, rotation about the yaw axis with a rotation about the pitch axis is actuated by movements of right piston 106a along its translation axis and left piston 106b along its translation axis that are at least one of: not concurrent, not matched in speed, or not matched in magnitude, along their respective translation axes.

Figure 12A:
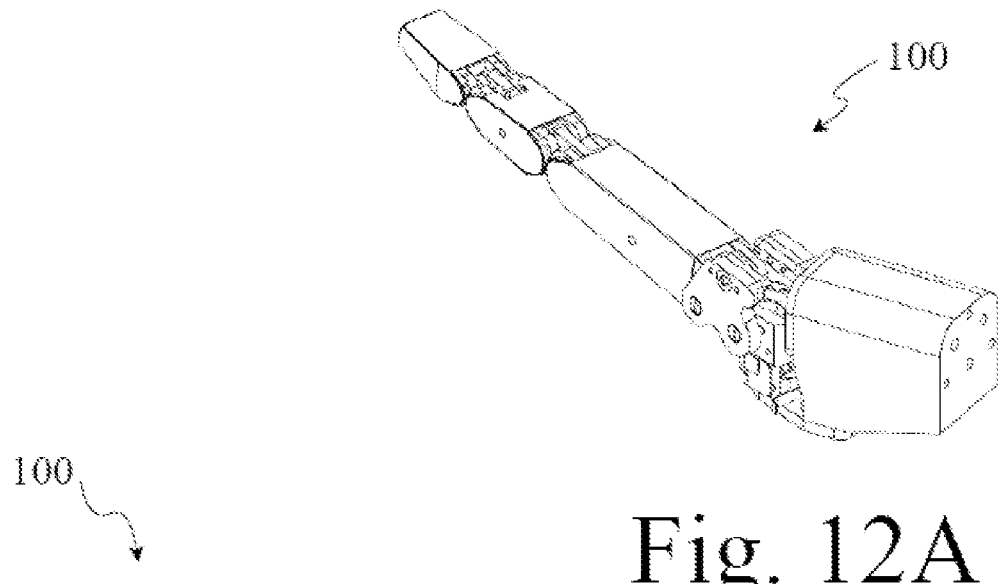
FIG. 12A is a top, left side, rear isometric view of the robotic mechanical digit of FIG. 1 in a yaw-right pose rotated clockwise about a yaw axis and actuated by an outward extension of the left piston and an inward retraction of the right piston, according to the present systems, devices, and methods.
Figure 12B:
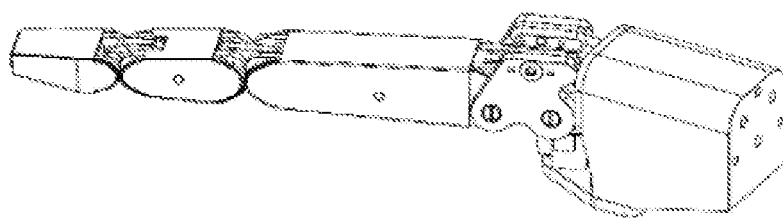
FIG. 12B is a top, left side, rear isometric view of the robotic mechanical digit of FIG. 1 in a yaw-left pose rotated counterclockwise about the yaw axis and actuated by an outward extension of the right piston and an inward retraction of the left piston, according to the present systems, devices, and methods.

FIG. 12A shows robotic mechanical digit 100 in a yaw-right pose actuated by an extension (outward travel from a neutral position) of the left piston 106b and a retraction (inward travel from a neutral position) of the right piston 106a in accordance with the present systems, devices, and methods. FIG. 12B shows robotic mechanical digit 100 in a yaw-left pose actuated by an extension (outward travel from a neutral position) of the right piston 106a and a retraction (inward travel from a neutral position) of the left piston 106b in accordance with the present systems, devices, and methods. Rotation about the yaw axis without rotation about the pitch axis is actuated by concurrent movements of the right piston 106a along its translation axis and the left piston 106b along its translation axis that are equal in speed and magnitude but opposite in direction with respect to one another along their respective translation axes.

Figure 12C:
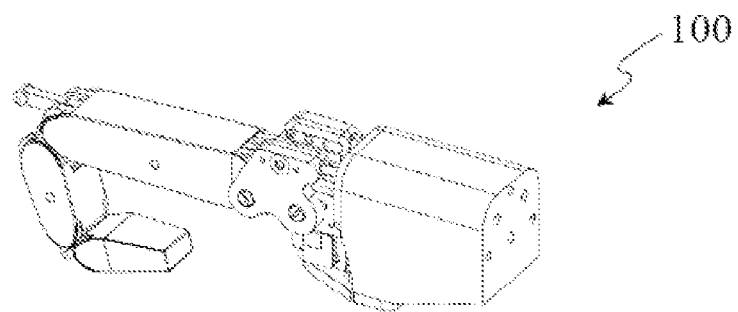
FIG. 12C is a top, left side, rear isometric view of the robotic mechanical digit of FIG. 1 in a curled pose rotated counterclockwise about one or more curl axes and actuated by an outward extension of a third piston, according to the present systems, devices, and methods.

FIG. 12C shows robotic mechanical digit 100 in a curled pose actuated by an extension (outward travel from a neutral position) of the bottom piston 604 in accordance with the present systems, devices, and methods.

Figure 13A:
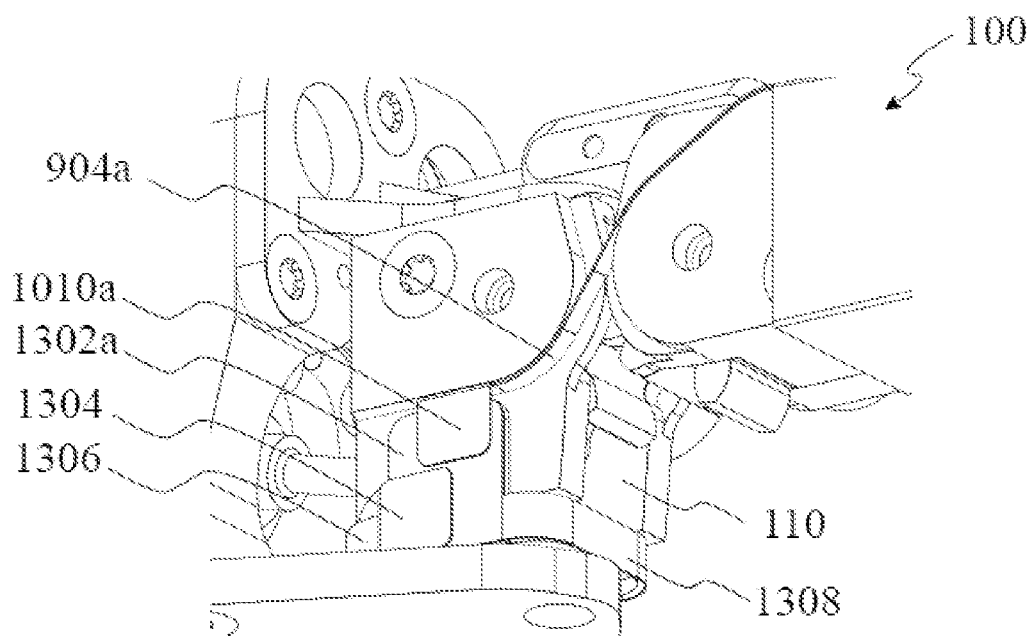
FIG. 13A is a front, bottom, left side isometric view of a portion of the robotic mechanical digit of FIG. 1, according to the present systems, devices, and methods.
Figure 13B:
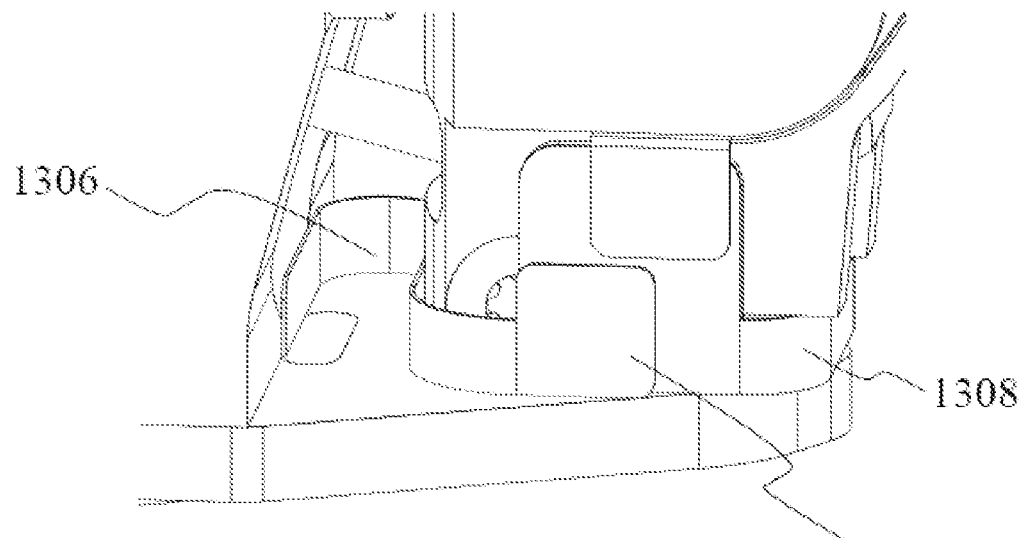
FIG. 13B is a front, top, left side isometric view of the portion of a robotic mechanical digit of FIG. 1, according to the present systems, devices, and methods.

FIG. 13A shows a first portion of robotic mechanical digit 100; FIG. 13B shows a second portion of robotic mechanical digit 100.

As illustrated in FIGS. 13A and 13B, the first right connection strip 904a couples mechanically and electrically through the connector pad 1010a to a right yaw carriage PCB 1302a which extends around the yaw carriage 110 through a connection strip 1308 to a left yaw carriage PCB, not visible in the figures but similar in design to the right yaw carriage PCB 1302a and coupling to the first left connection strip 904b. Also coupled to the right yaw carriage PCB 1302a is a yaw slack strip 1306 through a connector pad 1304. The yaw slack strip 1306 carries power and communication for the flexPCB 118 and is sufficiently flexible to not break through the yaw motion of the yaw carriage 110. The yaw slack strip 1306 terminates at the electrical connector port 202, visible in FIG. 2.

Figure 14:
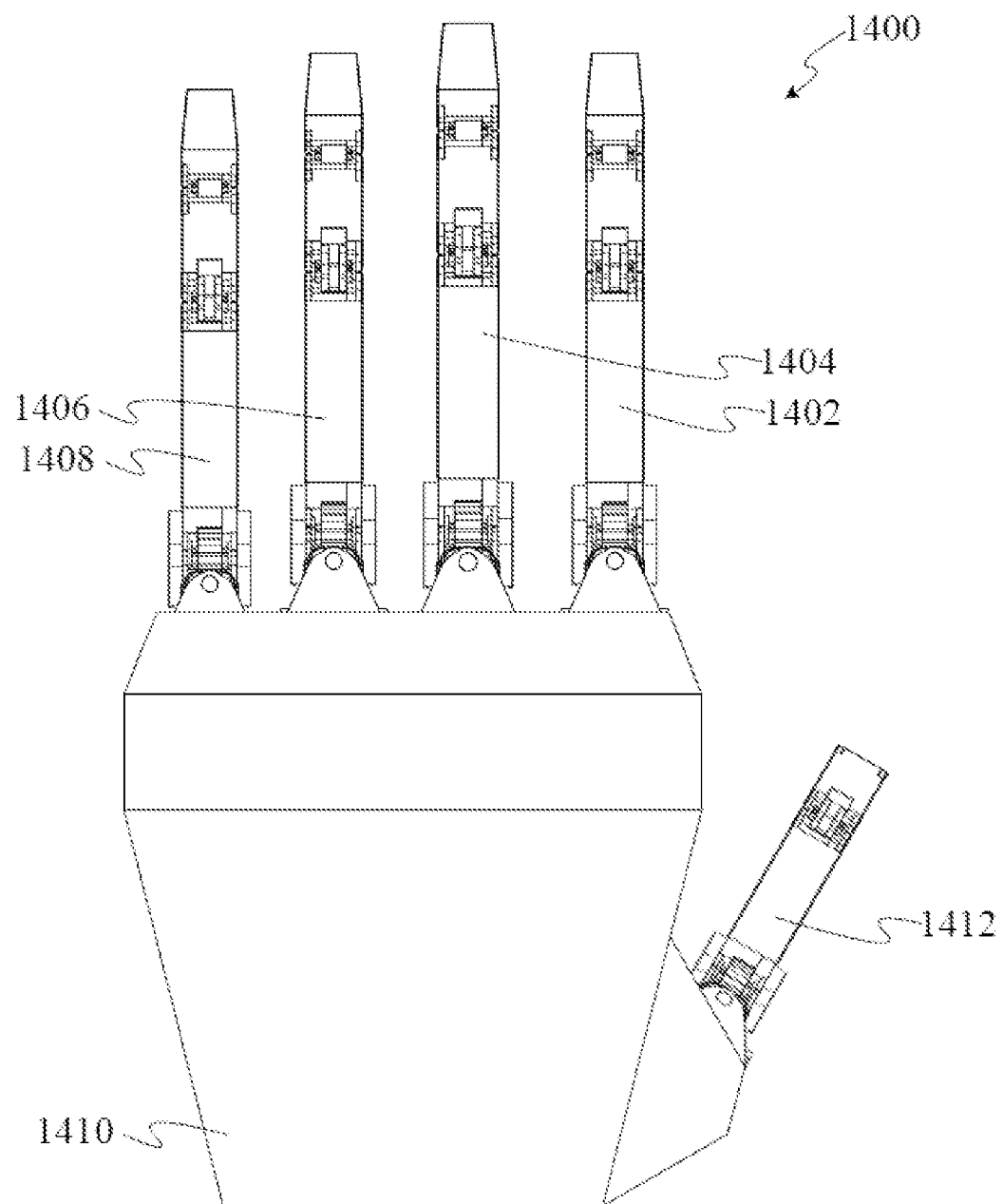
FIG. 14 is a top plan view of a robotic end effector comprising a hand with a palm and a plurality of mechanical digits that include four mechanical fingers and a mechanical thumb, according to the present systems, devices, and methods.

FIG. 14 shows a robotic mechanical hand 1400 comprised of a set of four (4) robotic mechanical digits in the form of mechanical fingers 1402, 1404, 1406, and 1408 coupled to a palm 1410. The robotic mechanical hand 1400 may also comprise a fifth mechanical digit in the form of a robotic mechanical thumb 1412 also coupled to the palm 1410. The robotic mechanical thumb 1412 may be positioned and operable to be opposed to one or more of mechanical fingers 1402, 1404, 1406, and 1408 to allow a pinching or grasping pose to be realized. The set of four robotic mechanical fingers may be of different sizes or of the same size as one another. There may be more or fewer such robotic mechanical fingers coupled to the palm 1410 to form such a robotic mechanical hand 1400. Any or all of robotic mechanical fingers 1402, 1404, 1406, and/or 1408 may be substantially similar to mechanical digit 100 as described throughout the present systems, devices, and methods.

While the embodiments illustrated and described in the above description comprise gear systems, linkages, and hydraulic pistons, these subsystems may be replaced by cables, compliant mechanisms, and/or rolling membrane pistons without significant changes to the operations and functionality of the embodiments, as those skilled in the relevant art will recognize.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

In addition, those skilled in the art will appreciate that control mechanisms taught herein for controlling a robotic member are capable of being distributed as a program product in a variety of forms, and that an illustrative embodiment applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to U.S. patent application Ser. No. 62/937,044 and U.S. provisional patent application Ser. No. 63/086,258, with the present disclosure are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A mechanical digit comprising:
a base;
a first phalanx;
a first rolling surface joint that rotationally mechanically couples the first phalanx to the base for rotation about one or more axes;
a second phalanx;
a second rolling surface joint that rotationally mechanically couples the second phalanx to the first phalanx for rotation about one or more axes;
a third phalanx;
a third rolling surface joint that rotationally mechanically couples the third phalanx to the second phalanx for rotation about one or more axes; and
a flexible printed circuit board that extends between the base and the third phalanx and which wraps partially about each of the first rolling surface joint, the second rolling surface joint, and the third rolling surface joint.

2. The mechanical digit of claim 1 wherein the flexible printed circuit board extends in a first rotational directional about a portion of a distal end of the first phalanx, extends in a second rotational direction about a portion of a proximate end of the second phalanx, extends in the second rotational direction about a portion of a distal end of the second phalanx, and extends in the first rotational direction about a portion of a proximal end of the third phalanx.

3. The mechanical digit of claim 2 wherein the first rotational direction is opposite the second rotational direction.

4. The mechanical digit of claim 3 wherein the first rotational direction and the second rotational direction are each respectively one of clockwise and counterclockwise.

5. The mechanical digit of claim 2 wherein the flexible printed circuit board extends in the first rotational direction about a portion of a proximal end of the first phalanx.

6. The mechanical digit of claim 2 wherein the flexible printed circuit board extends in the first rotational direction about a portion of a distal end of the third phalanx.

7. The mechanical digit of claim 1 wherein the first rolling surface joint rotationally mechanically couples the first phalanx to the base for rotation about a pitch axis.

8. The mechanical digit of claim 7 wherein the second rolling surface joint rotationally mechanically couples the second phalanx to the first phalanx for rotation about a first curl axis.

9. The mechanical digit of claim 8 wherein the third rolling surface joint rotationally mechanically couples the third phalanx to the second phalanx for rotation about a second curl axis.

10. The mechanical digit of claim 1 wherein the flexible printed circuit board runs inside of the first rolling surface joint, the second rolling surface joint, and the third rolling surface joint to provide a zero length change path for the flexible printed circuit board through a range of motion of the first mechanical digit about a yaw axis, the flexible printed circuit board having an amount of slack therein at least proximate the first base.

11. The mechanical digit of claim 1 wherein:
the first rolling surface joint comprises a first rolling surface of the first base and a second rolling surface of the first phalanx;
the flexible printed surface board extends over the first rolling surface of the first base and the second rolling surface of the first phalanx; and
respective surface curvatures of the first rolling surface of the first base and the second rolling surface of the first phalanx are respectively shaped relative to the pitch axis to ensure there is no length change in a path of the flexible printed circuit board when the first phalanx transitions into and between a neutral pose, a pitched-up pose, and a pitched-down pose.

12. The mechanical digit of claim 1, further comprising:
a pin joint that pivotally mechanically couples the first phalanx to the base for rotation about a yaw axis.

13. The mechanical digit of claim 1, further comprising:
at least one sensor physically and communicatively coupled to the flexible printed circuit board.

14. The mechanical digit of claim 13 wherein the at least one sensor is selected from a group consisting of: a tactile sensor, a force sensor, and a pressure sensor.

15. The mechanical digit of claim 1 wherein the flexible printed circuit board comprises polyimide material and a plurality of communicative electrical lines.

16. The mechanical digit of claim 1 wherein the flexible printed circuit board comprises a plurality of panels that fold around respective edges of the first phalanx, the second phalanx, and the third phalanx to cover a majority of respective external surface areas of the first phalanx, the second phalanx, and the third phalanx.

17. The mechanical digit of claim 1 wherein the base includes an electrical connector port electrically coupled to the flexible printed circuit board.

18. The mechanical digit of claim 17, further comprising a yaw slack flexible printed circuit board that electrically connects between the electrical connector port and the flexible printed circuit board.

* * * * *